US010058014B1

(12) United States Patent
Connor et al.

(10) Patent No.: US 10,058,014 B1
(45) Date of Patent: Aug. 21, 2018

(54) CONDUCTIVE ADHESIVE LAYER FOR GASKET ASSEMBLY

(71) Applicant: International Business Machines Corporation, Armonk, NY (US)

(72) Inventors: Samuel R. Connor, Apex, NC (US); Joseph Kuczynski, North Port, FL (US); Stuart B. Benefield, Durham, NC (US); Jonathan Jackson, Cedar Grove, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/841,077

(22) Filed: Dec. 13, 2017

(51) Int. Cl.
*H05K 9/00* (2006.01)
(52) U.S. Cl.
CPC ............ *H05K 9/0015* (2013.01); *H05K 9/009* (2013.01)
(58) Field of Classification Search
CPC .......................... H05K 9/0015; H05K 9/009
See application file for complete search history.

(56) References Cited

U.S. PATENT DOCUMENTS

| | | | |
|---|---|---|---|
| 3,783,072 A | 1/1974 | Korpman | |
| 4,548,862 A | 10/1985 | Hartman | |
| 5,082,595 A | 1/1992 | Glackin | |
| 5,300,340 A | 4/1994 | Calhoun et al. | |
| 5,712,449 A * | 1/1998 | Miska | H05K 9/0015 174/356 |
| 6,309,742 B1 * | 10/2001 | Clupper | B32B 5/18 427/247 |
| 6,465,731 B1 * | 10/2002 | Miska | H05K 9/0015 174/358 |
| 6,613,976 B1 * | 9/2003 | Benn, Jr. | H05K 9/0015 174/358 |
| 6,720,494 B1 * | 4/2004 | Norte | H05K 9/0015 174/388 |
| 6,784,363 B2 * | 8/2004 | Jones | H05K 9/0015 174/351 |

(Continued)

FOREIGN PATENT DOCUMENTS

| | | |
|---|---|---|
| CN | 106318244 A | 1/2017 |
| JP | 56038372 A | 4/1981 |

(Continued)

OTHER PUBLICATIONS

Czech, et al. "Electronically conductive acrylic pressure-sensitive adhesives containing carbon black," Polish Journal of Chemical Technology, 13, 4, 77-81, 2011, 10.2478/v10026-011-0053-2.

(Continued)

*Primary Examiner* — Hung V Ngo
(74) *Attorney, Agent, or Firm* — Patterson + Sheridan, LLP

(57) ABSTRACT

An apparatus suitable for EMC shielding applications comprises a first component comprising an electrically conductive first surface, and a gasket member comprising an electrically conductive exterior surface. The exterior surface is configured to couple with an electrically conductive second surface of a second component. The apparatus further comprises an adhesive layer disposed between the first component and the gasket member. The adhesive layer comprises an arrangement of conductive fibers, the conductive fibers extending along respective long axes between the first surface and the exterior surface.

20 Claims, 4 Drawing Sheets

(56) References Cited

U.S. PATENT DOCUMENTS

| | | | |
|---|---|---|---|
| 6,943,288 B1 * | 9/2005 | Miska | H05K 9/0015 |
| | | | 174/388 |
| 7,880,095 B2 * | 2/2011 | Kang | H05K 9/0015 |
| | | | 174/356 |
| 8,048,690 B2 | 11/2011 | Terada et al. | |
| 9,055,667 B2 * | 6/2015 | Doneker | H05K 9/0088 |
| 2003/0091777 A1 | 5/2003 | Jones et al. | |
| 2005/0205280 A1 * | 9/2005 | Fursich | H05K 9/0015 |
| | | | 174/359 |
| 2006/0213687 A1 * | 9/2006 | Kim | H05K 9/0015 |
| | | | 174/350 |
| 2006/0222774 A1 * | 10/2006 | Flanders | B29C 44/5618 |
| | | | 427/393.3 |
| 2008/0292840 A1 | 11/2008 | Majumdar et al. | |
| 2009/0095517 A1 | 4/2009 | Nonaka et al. | |
| 2009/0311502 A1 | 12/2009 | McCutcheon et al. | |
| 2010/0188833 A1 * | 7/2010 | Liang | H01B 1/04 |
| | | | 361/818 |
| 2015/0316955 A1 | 11/2015 | Dodds et al. | |
| 2016/0333232 A1 | 11/2016 | Choi et al. | |

FOREIGN PATENT DOCUMENTS

| | | |
|---|---|---|
| JP | 56038364 B2 | 10/2014 |
| KR | 1020010104574 | 11/2001 |
| WO | 2009025518 A2 | 2/2009 |

OTHER PUBLICATIONS

IP.com No. IPCOM000210119D "Electrostatic Dissipative Pressure Sensative Adhesive," Electronic Publication Date: Aug. 26, 2011.

\* cited by examiner

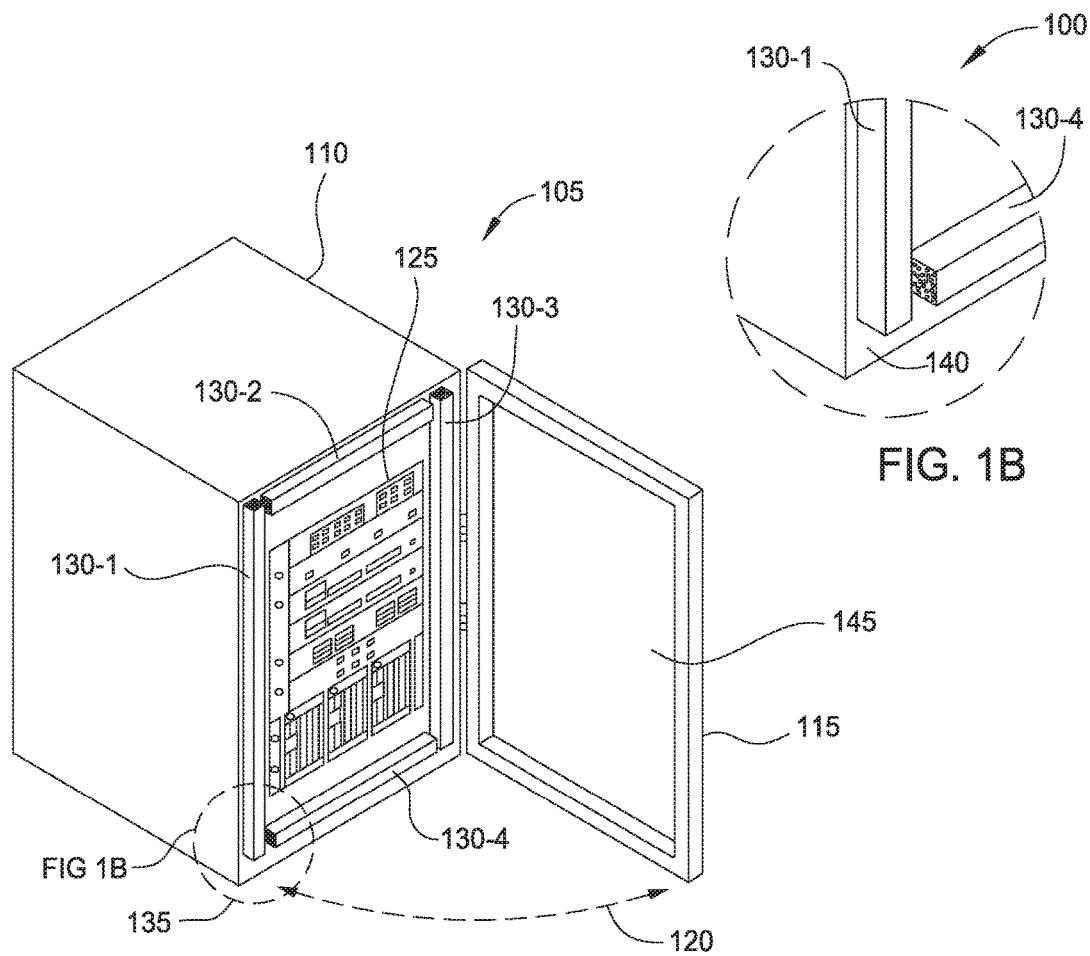
FIG. 1A
FIG. 1B
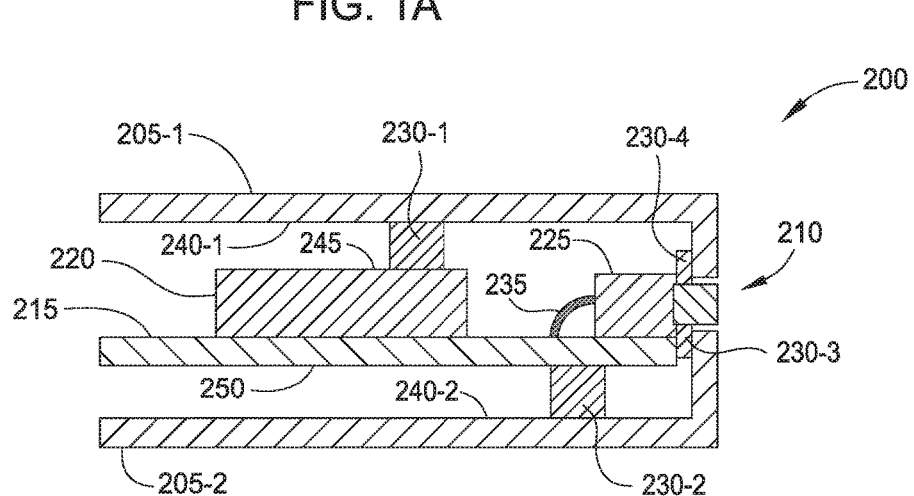
FIG. 2

CONDUCTIVE ADHESIVE LAYER FOR GASKET ASSEMBLY

BACKGROUND

The present disclosure relates to electromagnetic compatibility (EMC) shielding, and more specifically, to a conductive adhesive layer for a gasket assembly for EMC shielding applications.

SUMMARY

According to one embodiment, an apparatus comprises a first component comprising an electrically conductive first surface, and a gasket member comprising an electrically conductive exterior surface. The exterior surface is configured to couple with an electrically conductive second surface of a second component. The apparatus further comprises an adhesive layer disposed between the first component and the gasket member. The adhesive layer comprises an arrangement of conductive fibers, the conductive fibers extending along respective long axes between the first surface and the exterior surface.

According to another embodiment, a shielding apparatus for shielding electronic components comprises a body member defining an interior volume within which the electronic components are disposed, and a gasket member comprising an electrically conductive exterior surface configured to couple an electrically conductive first surface of the body member with an electrically conductive second surface. The shielding apparatus further comprises an adhesive layer configured to adhere the gasket member with a selected one of the first surface and the second surface. The adhesive layer comprises an arrangement of conductive fibers, the conductive fibers extending along respective long axes between the exterior surface and the selected one of the first surface and second surface.

According to another embodiment, a gasket assembly is disclosed for coupling an electrically conductive first surface with an electrically conductive second surface. The gasket assembly comprises a compressible core, an electrically conductive fabric extending around the compressible core and configured to couple with the first surface, and an adhesive layer coupled with the fabric and configured to couple with the second surface at a third surface. The adhesive layer comprises an arrangement of conductive fibers, the conductive fibers extending along respective long axes between the fabric and the third surface.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A and 1B illustrate a metal enclosure having exemplary gasket members, according to one or more embodiments.

FIG. 2 illustrates a metal chassis having exemplary gasket members, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 3A:
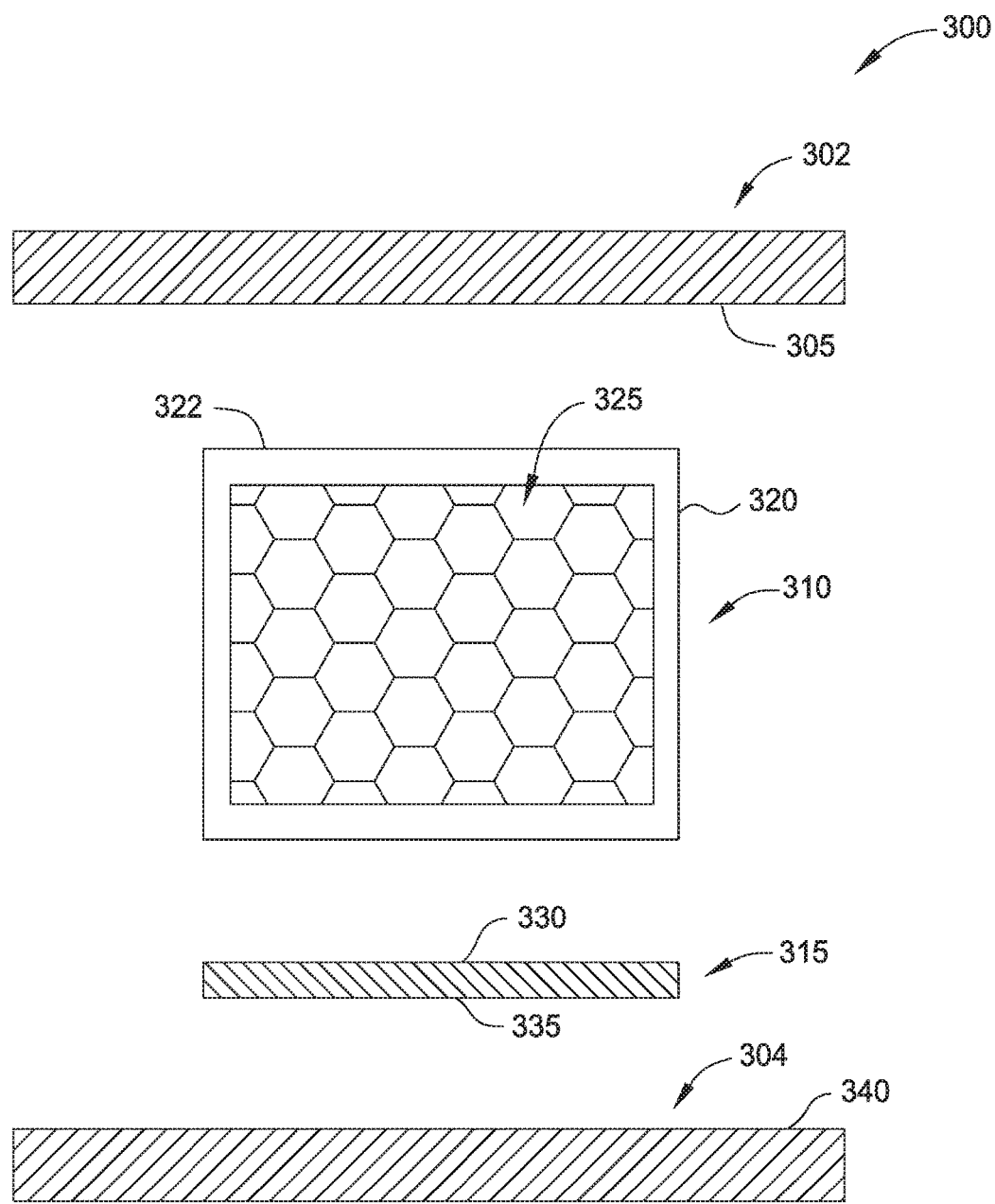
FIG. 3A is an exploded cross section view of an apparatus comprising an exemplary gasket member, according to one or more embodiments.

Gaskets are routinely used in EMC shielding applications to provide a desired mechanical and/or electrical coupling between different conductive components. One example of a gasket used in EMC shielding is a fabric over foam (FOF) gasket, which comprises a metallized fabric configured to couple with conductive surfaces of the different components. Adhesive materials, such as pressure-sensitive adhesives, may be used to mechanically adhere a gasket to a desired surface. However, adhesives having insulative properties can reduce the overall effectiveness of the EMC shielding, as the different components when electrically isolated will typically be at different potentials. Further, the different conductive components when electrically isolated may effectively form a slot antenna, by which EM energy may bypass the EMC shielding.

Various attempts have been made to provide pressure-sensitive adhesives with conductive qualities. However, merely embedding metallic particles in the adhesive can substantially reduce the tackiness and/or adhesive qualities of the adhesive, which in some cases may render the adhesive unsuitable for gasketing applications.

Embodiments disclosed herein describe a gasket assembly and related apparatus which use an adhesive layer comprising an arrangement of conductive fibers. The conductive fibers may extend along respective long axes across a thickness of the adhesive layer, which permits an electrical coupling between the gasket assembly and a surface attached thereto. In some embodiments, the conductive fibers are formed in the adhesive layer at loading levels that are substantially less than the percolation limit. In this way, the adhesive properties of the adhesive layer may remain suitable for gasketing applications while mitigating EMC issues.

FIGS. 1A and 1B illustrate a metal enclosure 105 having exemplary gasket members, according to one or more embodiments. More specifically, diagram 100 illustrates a metal enclosure 105 that houses electronic components 125. The metal enclosure 105 and the electronic components 125 may have any suitable implementation, such as a shielded enclosure for one or more rack-mounted computers.

The metal enclosure 105 comprises a body 110 (also referred to as body member 110) and a door 115 (also referred to as door member 115) that is pivotably coupled with the body 110. More specifically, the door 115 is configured to travel along a path 120 between an "open" position and a "closed" position, which will be discussed further below. Other implementations suitable for selectively opening the metal enclosure 105 (e.g., to access the electronic components 125) are also contemplated.

In some embodiments, the body 110 houses the electronic components 125. Stated another way, the body 110 defines an interior volume within which the electronic components 125 are at least partially disposed. In some embodiments, the electronic components 125 may extend to an opening formed in the body 110 (e.g., for accessibility). A plurality of gasket members 130-1, 130-2, 130-3, 130-4 (generically referred to as gasket member(s) 130) are coupled with the body 110 and are configured to substantially circumscribe the opening. Although four gasket members 130 are depicted, alternate numbers are also possible. For example, a single gasket member 130 may substantially circumscribe the opening.

The gasket members 130 may have any suitable cross section shape(s), which may depend on the arrangement of various surfaces of the metal enclosure 105. Some non-limiting examples of a cross section shape include a rectangle shape, a "D" shape, a "C fold" shape, a square shape, a round shape, a "B" shape, a "T" shape, a triangle shape, a knife shape, an oval shape, a "P" shape, and so forth.

In some embodiments, each gasket member 130 may be a FOF gasket comprising a metallized fabric that is wrapped or otherwise extends around a compressible core. The metallized fabric may provide the gasket member 130 with an electrically conductive exterior surface, which is configured to couple with multiple conductive surfaces of the metal enclosure 105.

Although not explicitly depicted in FIGS. 1A and 1B, each gasket member 130 may be coupled with the body 110 via a conductive adhesive layer. In this way, each gasket member 130 may be electrically coupled through the adhesive layer with an electrically conductive surface of the metal enclosure. For example, as shown in the inset 135, the gasket members 130-1, 130-4 may be electrically coupled through an adhesive layer with an electrically conductive surface 140 of the body 110.

Thus, when the door 115 is in an "open" position, the gasket members 130 are electrically coupled with the surface 140 of the body 110 via the conductive adhesive layer, and the gasket members 130 are isolated from an electrically conductive surface 145 of the door 115. When the door 115 is in a "closed" position, the gasket members 130 are also electrically coupled with the surface 145, such that a conductive path is formed between the surfaces 140, 145 via the conductive adhesive layer. In this way, the gasket members 130 are selectively coupled with the surface 145 of the door 115. Beneficially, the electrical coupling of the surfaces 140, 145 via the conductive adhesive layer improves the EMC shielding performance of the metal enclosure 105 and prevents the formation of a slot antenna between the gasket members 130 and the surface 140.

In one alternate implementation, the gasket members 130 may be coupled with the door 115 and may be selectively coupled with the surface 140 of the body 110 (i.e., when the door 115 is in a "closed" position). In another alternate implementation, the body 110 may be coupled with at least a first gasket member 130 and the door 115 may be coupled with at least a second gasket member 130.

FIG. 2 illustrates a metal chassis having exemplary gasket members, according to one or more embodiments. More specifically, diagram 200 depicts a cross section view of portions 205-1, 205-2 of a metal chassis that houses a printed circuit board (PCB) substrate 215 and electronic components 220, 225 mounted on the PCB substrate 215. Stated another way, the metal chassis may be described as a body member that defines an interior volume within which the PCB substrate 215 and the electronic components 220, 225 are at least partially disposed. The electronic components 220, 225 may have any suitable implementation, such as a computer processor, a memory, and/or other logic. As shown, a conductive communication link 235 extends between the electronic component 225 and the PCB substrate 215.

The portions 205-1, 205-2 of the metal chassis define an opening 210. For example, a connector or other suitable input port or output port may extend to the opening 210 and provide an external connectivity with the electronic components 220, 225.

A plurality of gasket members 230-1, 230-2, 230-3, 230-4 (generically, gasket member 230) are disposed within the metal chassis. The gasket members 230 may have qualities similar to the gasket members 130 of FIGS. 1A and 1B. For example, each gasket member 230 may comprise an electrically conductive exterior surface that is configured to couple an electrically conductive first surface with an electrically conductive second surface. In some embodiments, each gasket member 230 comprises a FOF gasket having any suitable shape. Further, each gasket member 230 may be coupled with the first surface or the second surface via a conductive adhesive layer.

As shown, the gasket member 230-1 is arranged between a surface 240-1 of the portion 205-1 and a surface 245 of the electronic component 220. The gasket member 230-2 is arranged between a surface 250 of the PCB substrate 215 and a surface 240-2 of the portion 205-2. The gasket member 230-3 is arranged between the portion 205-2 and the electronic component 225. The gasket member 230-4 is arranged between the portion 205-1 and the electronic component 225. In one embodiment, the gasket members 230-3, 230-4 are separate from each other. In another embodiment, the gasket members 230-3, 230-4 may be the same gasket member (e.g., a single gasket member 230 that circumscribes the opening 210).

FIG. 3A is an exploded cross section view 300 of an apparatus comprising an exemplary gasket member, according to one or more embodiments. The apparatus depicted in the view 300 may be used in conjunction with other embodiments disclosed herein. For example, the apparatus may represent a portion of the metal enclosure 105 of FIG. 1A or a portion of the metal chassis of FIG. 2.

The apparatus comprises a first component 302 comprising an electrically conductive first surface 305, and a second component 304 comprising an electrically conductive second surface 340. In one non-limiting example, the first component 302 may comprise one of the body 110 and the door 115 of the metal enclosure 105 of FIG. 1A, and the second component 304 may comprise the other of the body 110 and the door 115. In another non-limiting example, the first component 302 may comprise one of (i) the metal chassis and (ii) one of the PCB substrate 215 and the electrical components 220, 225 depicted in FIG. 2, and the second component 304 may comprise the other of (i) and (ii).

The apparatus further comprises a gasket member 310 comprising a compressible core 325 and a conductive fabric 320 that is wrapped or otherwise extends around the compressible core 325. In some embodiments, the compressible core 325 comprises a urethane or polyurethane foam. The conductive fabric 320 defines a conductive exterior surface 322 that is configured to couple with the first surface 305 and with a surface 330 of a conductive adhesive layer 315. In some embodiments, the conductive fabric 320 comprises a nickel-plated or otherwise metallized fabric.

The adhesive layer 315 may have any suitable implementation, such as an adhesive sheet or an adhesive tape. In some embodiments, the adhesive layer 315 comprises surfaces 330, 335 that may be substantially planar. In some embodiments, the adhesive layer 315 comprises a pressure-sensitive adhesive layer that is configured to adhere to a surface when pressure is applied. In some embodiments, the adhesive layer 315 comprises an arrangement of conductive fibers. The conductive fibers extend between the surfaces 330, 335 and are configured to provide a conductive path between the conductive fabric 320 and the electrically conductive second surface 340. In some embodiments, the conductive fibers may extend along respective long axes across a thickness of the adhesive layer (as shown, in the z-direction).

Figure 3B:
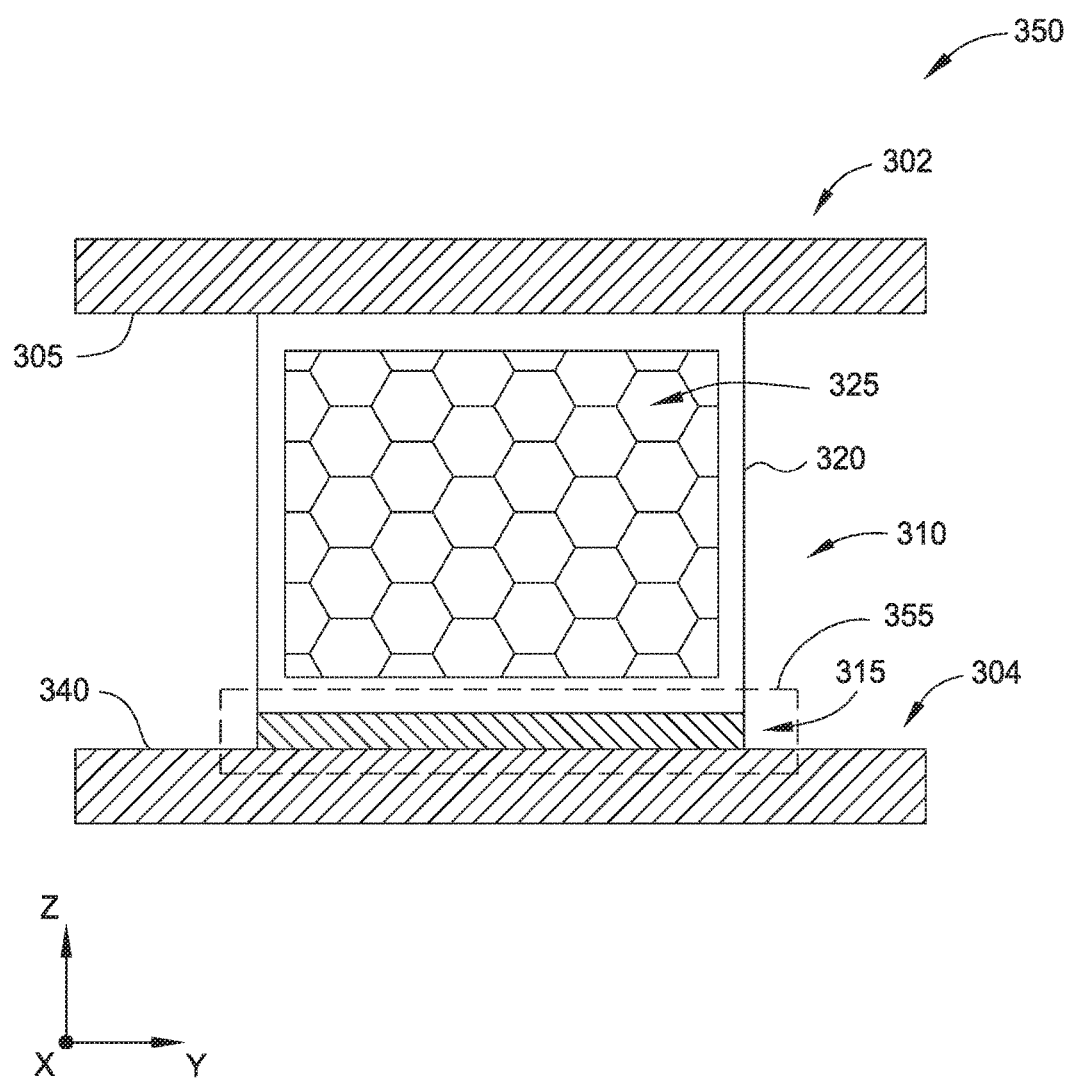
FIG. 3B is a cross section view of an apparatus comprising an exemplary gasket member, according to one or more embodiments.

FIG. 3B is a cross section view 350 of the apparatus comprising an exemplary gasket member, according to one or more embodiments. In view 350, the gasket member 310 is electrically coupled with the first surface 305 and with the second surface 340 through the adhesive layer 315. For implementations having an insulative adhesive, a region 355 of the apparatus tends to behave as a slot antenna and may radiate EM energy. However, because the adhesive layer 315 provides a conductive path between the conductive fabric 320 and the electrically conductive second surface 340, the region 355 does not act as a slot antenna and does not radiate EM energy.

Figure 4A:
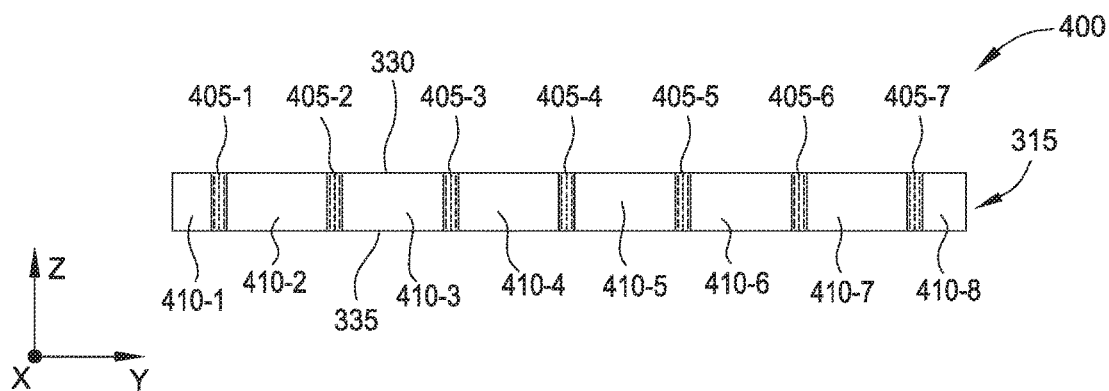
FIG. 4A is a cross section view of an exemplary adhesive layer, according to one or more embodiments.

FIG. 4A is a cross section view 400 of an exemplary adhesive layer 315, according to one or more embodiments. The adhesive layer 315 may be used in conjunction with other embodiments, such as the gasket members 130 of FIGS. 1A and 1B or the gasket members 230 of FIG. 2.

The adhesive layer 315 comprises a plurality of conductive fibers 405-1, 405-2, . . . , 405-7 (generically, conductive fibers 405) that extend along their respective long axes across a thickness of the adhesive layer 315. The plurality of conductive fibers 405-1, 405-2, . . . , 405-7 are spaced apart by a plurality of adhesive portions 410-1, 410-2, . . . , 410-8 (generically, adhesive portions 410) of the adhesive layer 315. Although seven conductive fibers 405 and eight adhesive portions 410 are illustrated, other numbers are also possible.

In some embodiments, the conductive fibers 405 comprise carbon fibers coated with an electrically conductive material comprising one of gold, silver, and nickel. Any suitable process may be used to produce the conductive fibers 405, such as electroplating.

The adhesive portions 410 may be formed of any suitable materials. In some embodiments, the adhesive portions 410 comprise pressure-sensitive adhesives. Some non-limiting examples of pressure-sensitive adhesive materials include an acrylate polymer, natural rubber, synthetic thermoplastic elastomer, silicon, silicone rubber, and so forth. The acrylate polymer may be formed of acrylate monomers such as 2-ethylhexyl acrylate, n-butyl acrylate, methyl acrylate, or t-butyl methacrylate.

The adhesive layer 315 may be formed according to any suitable process. For example, the adhesive layer 315 may be extruded according to known extrusion processes, and the plurality of conductive fibers 405 may have a desired orientation during the extrusion process. In some embodiments, the orientation of the conductive fibers 405 is in a substantially vertical direction (as shown, in the z-direction).

In some embodiments, the arrangement of the conductive fibers 405 may be a repeating arrangement, such as a grid of rows and columns. In other embodiments, the arrangement of the conductive fibers 405 is not a repeating arrangement. In some embodiments, a spacing between adjacent conductive fibers 405 is between about 200 microns and about 1000 microns. In one exemplary embodiment, the spacing between adjacent conductive fibers 405 is about 500 microns. The spacing of the conductive fibers 405 may correspond to loading levels of the adhesive layer 315 that are substantially less than the percolation limit. Beneficially, the adhesive properties of the adhesive layer 315 may remain suitable for gasketing applications while having a electrical conductivity that is suitable for mitigating EMC issues. Further, the relatively greater spacing between adjacent conductive fibers 405, made possible according to the techniques described herein, may provide a reduced cost of the adhesive layer 315 and/or the gasket member 230.

Figure 4B:
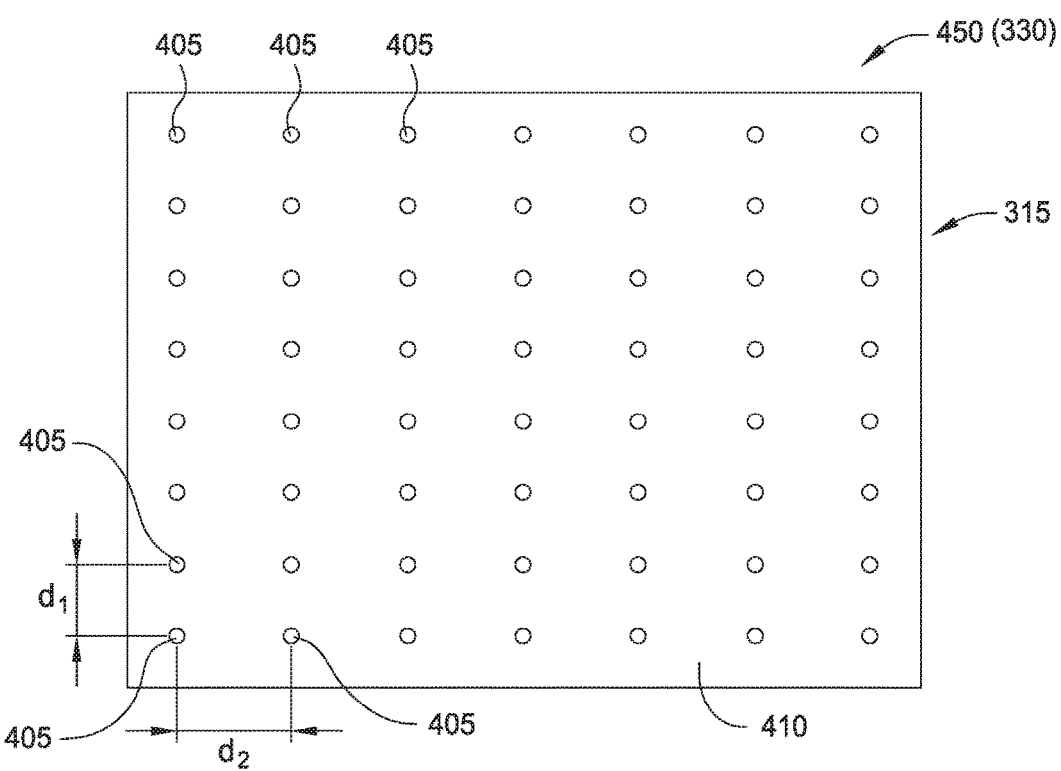
FIG. 4B is a top view of an exemplary adhesive layer, according to one or more embodiments.

FIG. 4B is a top view 450 of an exemplary adhesive layer 315, according to one or more embodiments. More specifically, view 450 depicts a surface 330 of the adhesive layer 315, in which the arrangement of the conductive fibers 405 is in a repeating arrangement of rows and columns. In some embodiments, adjacent conductive fibers 405 of a column (i.e., in adjacent rows) are separated by a first spacing $d_1$ (in the x-direction) and conductive fibers 405 of a row (i.e., in adjacent columns) are separated by a second spacing $d_2$ (in the y-direction). The first spacing $d_1$ and the second spacing $d_2$ may be the same value or different values. In some cases, the first spacing $d_1$ and the second spacing $d_2$ are selected from with a range between about 200 microns and about 1000 microns. The spacing of the conductive fibers 405 may correspond to loading levels of the adhesive layer 315 that are substantially less than the percolation limit. Beneficially, the adhesive properties of the adhesive layer 315 may remain suitable for gasketing applications while having a electrical conductivity suitable for mitigating EMC issues.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

While the foregoing is directed to embodiments of the present disclosure, other and further embodiments of the disclosure may be devised without departing from the basic scope thereof, and the scope thereof is determined by the claims that follow.

What is claimed is:

1. An apparatus comprising:
   a first component comprising an electrically conductive first surface;
   a gasket member comprising an electrically conductive exterior surface, the exterior surface configured to couple with an electrically conductive second surface of a second component; and
   an adhesive layer disposed between the first component and the gasket member, the adhesive layer comprising an arrangement of conductive fibers, the conductive fibers extending along respective long axes between the first surface and the exterior surface.

2. The apparatus of claim 1, wherein the gasket member further comprises a compressible core,
   wherein the exterior surface comprises an electrically conductive fabric extending around the compressible core, and
   wherein the adhesive layer comprises a pressure-sensitive adhesive layer coupled with the gasket member.

3. The apparatus of claim 1, wherein the first component comprises a selected one of (i) a body of a metal enclosure and (ii) a door of the metal enclosure, and
   wherein the second component comprises the other of the body and the door.

4. The apparatus of claim 1, wherein the first component comprises one of (i) a printed circuit board (PCB) substrate arranged within a metal chassis and (ii) the metal chassis, and
   wherein the second component comprises the other of the PCB substrate and the metal chassis.

5. The apparatus of claim 1, wherein the adhesive layer defines a third surface and a fourth surface that are substantially planar, and
   wherein the long axes of the conductive fibers are substantially perpendicular to the third surface and to the fourth surface.

6. The apparatus of claim 1, wherein the conductive fibers comprise carbon fibers coated with an electrically conductive material comprising one of gold, silver, and nickel.

7. The apparatus of claim 1, wherein the arrangement of conductive fibers comprises a repeating arrangement in which a spacing between adjacent conductive fibers is between about 200 microns and about 1000 microns.

8. A shielding apparatus for shielding electronic components, the shielding apparatus comprising:
   a body member defining an interior volume within which the electronic components are at least partially disposed;
   a gasket member comprising an electrically conductive exterior surface configured to couple an electrically conductive first surface of the body member with an electrically conductive second surface; and
   an adhesive layer configured to adhere the gasket member with a selected one of the first surface and the second surface, the adhesive layer comprising an arrangement of conductive fibers, the conductive fibers extending along respective long axes between the exterior surface and the selected one of the first surface and second surface.

9. The shielding apparatus of claim 8, wherein the gasket member further comprises a compressible core,
   wherein the exterior surface comprises an electrically conductive fabric extending around the compressible core, and
   wherein the adhesive layer comprises a pressure-sensitive adhesive layer coupled with the gasket member.

10. The shielding apparatus of claim 8, wherein the second surface comprises a surface of a door pivotably coupled with the body member.

11. The shielding apparatus of claim 8, wherein the second surface comprises a surface defined by the electronic components.

12. The shielding apparatus of claim 11, wherein the surface defined by the electronic components comprises a surface of a printed circuit board (PCB) substrate.

13. The shielding apparatus of claim 8, wherein the adhesive layer defines a third surface and a fourth surface that are substantially planar, and
    wherein the long axes of the conductive fibers are substantially perpendicular to the third surface and to the fourth surface.

14. The shielding apparatus of claim 8, wherein the conductive fibers comprise carbon fibers coated with an electrically conductive material comprising one of gold, silver, and nickel.

15. The shielding apparatus of claim 8, wherein the arrangement of conductive fibers comprises a repeating arrangement in which a spacing between adjacent conductive fibers is between about 200 microns and about 1000 microns.

16. A gasket assembly for coupling an electrically conductive first surface with an electrically conductive second surface, the gasket assembly comprising:
    a compressible core;
    an electrically conductive fabric extending around the compressible core and configured to couple with the first surface; and
    an adhesive layer coupled with the fabric and configured to couple with the second surface at a third surface, the adhesive layer comprising an arrangement of conductive fibers, the conductive fibers extending along respective long axes between the fabric and the third surface.

17. The gasket assembly of claim 16, wherein the long axes of the conductive fibers are substantially perpendicular to the third surface.

18. The gasket assembly of claim 16, wherein the adhesive layer comprises a pressure-sensitive adhesive layer configured to adhere with the second surface responsive to application of pressure.

19. The gasket assembly of claim 16, wherein the conductive fibers comprise carbon fibers coated with an electrically conductive material comprising one of gold, silver, and nickel.

20. The gasket assembly of claim 16, wherein the arrangement of conductive fibers comprises a repeating arrangement in which a spacing between adjacent conductive fibers is between about 200 microns and about 1000 microns.

* * * * *